United States Patent
Kim et al.

(10) Patent No.: US 10,968,390 B2
(45) Date of Patent: Apr. 6, 2021

(54) COMPOSITION FOR SEMICONDUCTOR PROCESS AND SEMICONDUCTOR PROCESS

(71) Applicant: SKC CO., LTD., Gyeonggi-do (KR)

(72) Inventors: Byoungsoo Kim, Gyeonggi-do (KR); Gyu An Jin, Gyeonggi-do (KR); Jun Rok Oh, Seoul (KR)

(73) Assignee: SKC CO., LTD., Gyeonggi-do (KR)

( * ) Notice: Subject to any disclaimer, the term of this patent is extended or adjusted under 35 U.S.C. 154(b) by 0 days.

(21) Appl. No.: 16/293,476

(22) Filed: Mar. 5, 2019

(65) Prior Publication Data
US 2019/0276740 A1 Sep. 12, 2019

(30) Foreign Application Priority Data
Mar. 6, 2018 (KR) .................. 10-2018-0026276

(51) Int. Cl.
| | | |
|---|---|---|
| *C11D 9/36* | (2006.01) | |
| *C09K 13/06* | (2006.01) | |
| *H01L 21/02* | (2006.01) | |
| C08L 83/04 | (2006.01) | |
| C07F 7/18 | (2006.01) | |
| C09K 13/00 | (2006.01) | |

(52) U.S. Cl.
CPC ........ *C09K 13/06* (2013.01); *H01L 21/02054* (2013.01); *C07F 7/18* (2013.01); *C08L 83/04* (2013.01); *C09K 13/00* (2013.01)

(58) Field of Classification Search
CPC .................................. C11D 11/0047
USPC ....................................... 510/175
See application file for complete search history.

(56) References Cited

U.S. PATENT DOCUMENTS

| | | | | |
|---|---|---|---|---|
| 9,589,789 | B2* | 3/2017 | Phillips | H01L 21/76828 |
| 2015/0187670 | A1* | 7/2015 | Ono | H01L 21/31133 257/741 |
| 2016/0096977 | A1* | 4/2016 | Tachibana | H01L 21/02211 257/618 |
| 2016/0096978 | A1* | 4/2016 | Tachibana | C09D 185/04 438/703 |
| 2016/0252819 | A1* | 9/2016 | Sugishima | H01L 29/0847 430/258 |
| 2016/0276152 | A1* | 9/2016 | Tachibana | H01L 21/31122 |
| 2016/0288289 | A1* | 10/2016 | Suzuki | C09K 3/1463 |
| 2016/0289455 | A1* | 10/2016 | Inaoka | C07F 7/02 |
| 2018/0277357 | A1* | 9/2018 | Wojtczak | H01L 21/02052 |
| 2019/0112523 | A1* | 4/2019 | Kim | C09K 11/02 |
| 2019/0136090 | A1* | 5/2019 | Park | H01L 21/02458 |
| 2019/0187560 | A1* | 6/2019 | Kayaba | G03F 7/094 |

FOREIGN PATENT DOCUMENTS

| | | |
|---|---|---|
| JP | H08-83792 A | 3/1996 |
| JP | 2000-19744 A | 1/2000 |
| JP | 2000-58500 A | 2/2000 |
| JP | 2012-099550 A | 5/2012 |
| JP | 2014-99480 A | 5/2014 |
| KR | 10-1539375 | 7/2015 |
| KR | 10-2017-0135889 | 12/2017 |

OTHER PUBLICATIONS

Office Action Issued by Korean Patent office dated Mar. 21, 2019.
Office Action issued by Japanese Patent Office dated Mar. 10, 2020.
Office Action issued by Japanese Patent Office dated Aug. 25, 2020.

* cited by examiner

*Primary Examiner* — Gregory E Webb
(74) *Attorney, Agent, or Firm* — IP & T Group LLP

(57) ABSTRACT

Provided are a composition for a semiconductor process, which comprises a first component comprising an inorganic acid or an organic acid; and a second component comprising a silicon compound represented by Formula 1, and a semiconductor process, which comprises selectively cleaning and/or removing an organic substance or an inorganic substance using the composition.

16 Claims, No Drawings

COMPOSITION FOR SEMICONDUCTOR PROCESS AND SEMICONDUCTOR PROCESS

The present application claims priority of Korean patent application number 10-2018-0026276 filed on Mar. 6, 2018, which is incorporated herein by reference in its entirety.

TECHNICAL FIELD

Embodiments relate to a composition applied to a semiconductor process and a semiconductor process using the same.

BACKGROUND ART

Semiconductors are fabricated by forming a pattern by various processes on a wafer made of silicon (Si), gallium arsenide (GaAs), or the like as a base material. Such a process for fabricating a semiconductor is comprised of multiple steps in which various organic or inorganic materials are used. Specifically, the semiconductor process comprises such steps as a wafer production process, an oxidation process, an exposure process, an etching process, an ion implantation process, a deposition process, a polishing process, and a cleaning process.

Specifically, in the wafer production process, silicon that exists in the form of silica or silicate is processed into polycrystalline silicon and then processed into monocrystalline silicon by a physical refining method. Such monocrystalline silicon is grown to produce a cylinder-shaped ingot, which is thinly cut and polished to produce a disk-shaped wafer.

In the oxidation process, the wafer is oxidized to form a silicon oxide film on the surface thereof. The oxide film formed on the surface of a wafer serves as a protective film in the diffusion process, protects and stabilizes the surface, and ensures the electrical insulation of the surface.

In the exposure process, a circuit pattern is formed on the surface of a wafer by using a mask having an image of a circuit. A photoresist is thinly coated on the surface of a wafer to form a photoresist film, and light is irradiated using an exposure apparatus to form a circuit on the wafer. The photoresist film may serve as a protective film in the etching process, the ion implantation process, and the like. The exposure process may be carried out using an electron beam or an X-ray other than light.

In the etching process, the surface of a wafer on which the photoresist film pattern has been formed is selectively removed. The etching process is divided into a wet process and a dry process. In the wet process, an etching solution is used for the etching. In the dry process, plasma, sputter, ion beam, or the like is used for the etching.

In the ion implantation process, dopant ions are implanted into a wafer to make it a semiconductor. A wafer does not conduct electricity in a pure state. When ions are implanted through the ion implantation process, then it allows electricity to flow.

In the deposition process, a material having electrical characteristics is deposited on a wafer. As the deposition method, such a method as chemical vapor deposition (CVD) or physical vapor deposition (PVD) may be used.

In the polishing process, a rough surface of a wafer is polished to form a mirror-surface planarized region. The polishing process is carried out using a chemical and/or mechanical method, which may be referred to as a CMP (chemical mechanical polishing) process. In the CMP process, both the chemical action and the physical action are simultaneously applied to polish the wafer surface.

The cleaning process refers to any process for removing impurities of a wafer. The cleaning process removes unnecessary organic or inorganic substances from the wafer surface, thereby facilitating the subsequent processes.

These various semiconductor processes can be designed in an appropriate order as needed to produce high-quality semiconductors with various functions. In addition, various compositions are used in such semiconductor processes. Since the process efficiency and final physical properties of a wafer vary depending on such a composition, it is one of the important tasks to design a composition suitable for each purpose.

DISCLOSURE OF THE INVENTION

Technical Problem

An embodiment of the present invention provides a composition for a semiconductor process, wherein the composition is applied to the semiconductor process to provide a wafer that has excellent surface properties.

Another embodiment of the present invention provides a semiconductor process, which is carried out using the composition for a semiconductor process.

Solution to the Problem

In an embodiment of the present invention, there is provided a composition for a semiconductor process, which comprises a first component comprising an inorganic acid or an organic acid; and a second component comprising a compound represented by the following Formula 1.

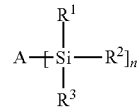

[Formula 1]

In the above Formula 1, A is selected from a $C_1$-$C_{30}$ aliphatic moiety, a $C_6$-$C_{30}$ aromatic moiety, a boron (B) moiety, and an amine moiety, $R^1$ to $R^3$ are each independently selected from hydrogen, a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aliphatic ring group, a substituted or unsubstituted $C_4$-$C_{30}$ heteroaliphatic ring group, a substituted or unsubstituted $C_6$-$C_{30}$ aromatic ring group, a substituted or unsubstituted $C_4$-$C_{30}$ heteroaromatic ring group, a substituted or unsubstituted amine group, and a halogen group, at least one of $R^1$ to $R^3$ is a $C_1$-$C_{30}$ alkoxy group or a halogen group, and n is an integer of 2 to 6.

In another embodiment of the present invention, there is provided a semiconductor process, which comprises a cleaning process wherein an organic substance or an inorganic substance is selectively cleaned using the composition for a semiconductor process; a removal process wherein an organic substance or an inorganic substance is selectively removed using the composition for a semiconductor process; or both of them.

Advantageous Effects of the Invention

The composition for a semiconductor process is a composition in which specific components are appropriately blended. It can be applied to a semiconductor process that meets the production purposes to perform an excellent function. A semiconductor fabricated through the process can have improved qualities.

DETAILED DESCRIPTION FOR CARRYING OUT THE INVENTION

The advantages and features of the present invention and the methods of achieving them will become apparent with reference to the embodiments described hereinafter. However, the present invention is not limited to the embodiments described below, but may be embodied in various different forms. These embodiments are provided so that the disclosure of the present invention will be thorough and complete, and will fully convey the scope of the invention to those skilled in the art. The invention is defined by only the scope of the claims.

The term "moiety" as used herein refers to the entire structure that contains at least a part of the corresponding chemical structure or the corresponding element.

In addition, all numerical ranges and expressions related to the amount of a component, reaction conditions, and the like used herein are to be understood as being modified by the term "about," unless otherwise indicated.

In addition, the term "substituted" as used herein means to be substituted with at least one selected from the group consisting of deuterium, a halogen group (—F, —Cl, —Br, —I), a hydroxyl group, a cyano group, a nitro group, an amino group, an amidino group, a hydrazine group, a hydrazone group, an ester group, a ketone group, a carboxyl group, a substituted or unsubstituted alkyl group, a substituted or unsubstituted alkenyl group, a substituted or unsubstituted alkynyl group, a substituted or unsubstituted alkoxy group, a substituted or unsubstituted alicyclic organic group, a substituted or unsubstituted hetero ring group, a substituted or unsubstituted aryl group, and a substituted or unsubstituted heteroaryl group. The substituents enumerated above may be connected to each other to form a ring.

The terms first, second, and the like are used herein to describe various components, and the components should not be limited by the terms. The terms are used only for the purpose of distinguishing one component from another.

In an embodiment, there is provided a composition for a semiconductor process, which comprises a first component comprising an inorganic acid or an organic acid; and a second component comprising a compound represented by the following Formula 1.

[Formula 1]

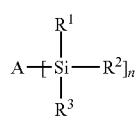

In the above Formula 1, A is selected from a $C_1$-$C_{30}$ aliphatic moiety, a $C_6$-$C_{30}$ aromatic moiety, a boron (B) moiety, and an amine moiety, $R^1$ to $R^3$ are each independently selected from hydrogen, a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aliphatic ring group, a substituted or unsubstituted $C_4$-$C_{30}$ heteroaliphatic ring group, a substituted or unsubstituted $C_6$-$C_{30}$ aromatic ring group, a substituted or unsubstituted $C_4$-$C_{30}$ heteroaromatic ring group, a substituted or unsubstituted amine group, and a halogen group, at least one of $R^1$ to $R^3$ is a $C_1$-$C_{30}$ alkoxy group or a halogen group, and n is an integer of 2 to 6.

The composition for a semiconductor process, which comprises the first component and the second component, can secure an etching, removing, or cleaning function for a component of a specific material. As a result, it can be applied to an appropriate semiconductor process to thereby fabricate a semiconductor with an enhanced quality.

A in the above Formula 1 is a core in a ballast structure. The "ballast" structure refers to a chemical structure in which two or more functional groups can be substituted.

In the case where A in the above Formula 1 is a $C_1$-$C_{30}$ aliphatic moiety, A may be selected from a substituted or unsubstituted $C_1$-$C_{30}$ alkyl group, a substituted or unsubstituted $C_3$-$C_{30}$ cycloalkyl group; a substituted or unsubstituted $C_2$-$C_{30}$ heterocycloalkyl group; a substituted or unsubstituted $C_2$-$C_{30}$ alkenyl group; a substituted or unsubstituted $C_3$-$C_{30}$ cycloalkenyl group; a substituted or unsubstituted $C_2$-$C_{30}$ heterocycloalkenyl group; a substituted or unsubstituted $C_2$-$C_{30}$ alkynyl group.

That is, since n in the above Formula 1 is an integer of 2 to 6, in the case where A is a $C_1$-$C_{30}$ aliphatic moiety, the silicon compound of the above Formula 1 may be a compound selected from a $C_1$-$C_{30}$ alkane, a $C_3$-$C_{30}$ cycloalkane, a $C_2$-$C_{30}$ heterocycloalkane, a $C_2$-$C_{30}$ alkene, a $C_3$-$C_{30}$ cycloalkane, a $C_2$-$C_{30}$ heterocycloalkane, and a $C_2$-$C_{30}$ alkyne, in which at least 2 to 6 hydrogen atoms are substituted with a functional group of the following Formula 2.

[Formula 2]

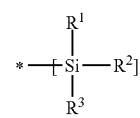

In the above Formula 2, * represents a bonding position with A, and $R^1$ to $R^3$ are as defined in the above Formula 1.

In addition, the cycloalkyl group, the cycloalkenyl group, the heterocycloalkyl group, and the heterocycloalkenyl group are to be understood to encompass a polycyclic group such as a fused ring group, a spiro ring group, and a bridged ring group.

In the case where A in the above Formula 1 is a $C_6$-$C_{30}$ aromatic moiety, A may be selected from a substituted or unsubstituted $C_6$-$C_{30}$ aromatic ring; and a substituted or unsubstituted $C_4$-$C_{30}$ heteroaromatic ring group.

That is, since n in the above Formula 1 is an integer of 2 to 6, in the case where A is a $C_6$-$C_{30}$ aromatic moiety, the silicon compound of the above Formula 1 may be a compound selected from a $C_6$-$C_{30}$ aromatic compound or a $C_4$-$C_{30}$ heteroaromatic compound, in which at least 2 to 6 hydrogen atoms are substituted with a functional group of the above Formula 2.

In addition, the aromatic ring group and the heteroaromatic ring group are to be understood to encompass a polycyclic group such as a fused ring group or the like.

In the case where A in the above Formula 1 is a boron (B) moiety, n may be an integer of 2 to 3. That is, the silicon compound of the above Formula 1 may be a compound in which 2 or 3 functional groups of the above Formula 2 are bonded to boron.

In the above Formula 1, A may be an amine moiety, and n may be an integer of 2 to 3. That is, the silicon compound of the above Formula 1 may be a compound in which 2 or 3 functional groups of the above Formula 2 are bonded to the terminal of an amine compound.

In an embodiment, A in the above Formula 1 may be one selected from the following Formulae 1-1 to 1-5. That is, the compound of the above Formula 1 may have a structure in which the functional group of the above Formula 2 is bonded to at least two positions out of those denoted by * in the chemical structures represented by the following Formulae 1-1 to 1-5.

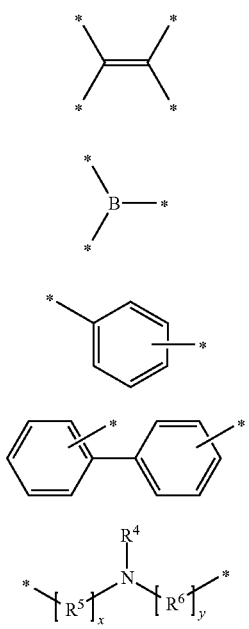

In the above Formula 1-5, $R^5$ and $R^6$ each independently may be selected from a substituted or unsubstituted $C_1$-$C_{30}$ alkylene group; a substituted or unsubstituted $C_3$-$C_{30}$ cycloalkylene group; a substituted or unsubstituted $C_2$-$C_{30}$ heterocycloalkylene group; a substituted or unsubstituted $C_2$-$C_{30}$ alkenylene group; a substituted or unsubstituted $C_3$-$C_{30}$ cycloalkenylene group; a substituted or unsubstituted $C_2$-$C_{30}$ heterocycloalkenylene group; and a substituted or unsubstituted $C_2$-$C_{30}$ alkynylene group.

In addition, in the above Formula 1-5, $R^4$ may be selected from hydrogen; a substituted or unsubstituted $C_1$-$C_{30}$ alkyl group, a substituted or unsubstituted $C_3$-$C_{30}$ cycloalkyl group; a substituted or unsubstituted $C_2$-$C_{30}$ heterocycloalkyl group; a substituted or unsubstituted $C_2$-$C_{30}$ alkenyl group; a substituted or unsubstituted $C_3$-$C_{30}$ cycloalkenyl group; a substituted or unsubstituted $C_2$-$C_{30}$ heterocycloalkenyl group; and a substituted or unsubstituted $C_2$-$C_{30}$ alkynyl group.

In addition, in the above Formula 1-5, x and y each independently may be an integer of 1 to 20, for example, an integer of 1 to 10, for example, an integer of 1 to 5.

In such event, one selected from hydrogen, a substituted or unsubstituted $C_1$-$C_{30}$ alkyl group; a substituted or unsubstituted $C_3$-$C_{30}$ cycloalkyl group; a substituted or unsubstituted $C_2$-$C_{30}$ heterocycloalkyl group; a substituted or unsubstituted $C_2$-$C_{30}$ alkenyl group; a substituted or unsubstituted $C_3$-$C_{30}$ cycloalkenyl group; a substituted or unsubstituted $C_2$-$C_{30}$ heterocycloalkenyl group; a substituted or unsubstituted $C_2$-$C_{30}$ alkynyl group; and an amine group may be located at the positions denoted by * of A, to which the functional group of the above Formula 2 is not bonded.

In an embodiment, in the above Formula 1, A is not bonded with the functional group of the above Formula 2 through an —O— bonding. That is, in the above Formula 1, A does not have an —O— structure at the connecting position of Si. As a result, the silicon compound of the above Formula 1 can maintain a bulk structure in the composition, which enables the composition for a semiconductor process to have excellent reactivity.

In an embodiment, the silicone compound may be a compound in which A in the above Formula 1 has a structure of the above Formula 1-3, $R^1$ to $R^3$ are each selected from a $C_1$-$C_5$ alkoxy group, and n is 2 or 3.

In another embodiment, the silicone compound may be a compound in which A in the above Formula 1 has a structure of the above Formula 1-2, $R^1$ to $R^3$ are each selected from a $C_1$-$C_5$ alkoxy group, and n is 2 or 3.

In still another embodiment, the silicone compound may be a compound in which A in the above Formula 1 has a structure of the above Formula 1-1, $R^1$ to $R^3$ are each selected from a $C_1$-$C_5$ alkoxy group, and n is 2 or 3.

In still another embodiment, the silicone compound may be a compound in which A in the above Formula 1 has a structure of the above Formula 1-1, $R^1$ to $R^3$ are each selected from a halogen group, and n is 2 or 3.

In still another embodiment, the silicone compound may be a compound in which A in the above Formula 1 has a structure of the above Formula 1-1, $R^1$ and $R^2$ are each selected from a $C_1$-$C_5$ alkoxy group, $R^3$ is a $C_1$-$C_{10}$ alkyl group, and n is 2 or 3.

In still another embodiment, the silicone compound may be a compound in which A has a structure of the above Formula 1-5, n is 2, $R^1$ to $R^3$ are each selected from a $C_1$-$C_5$ alkoxy group, $R^4$ is hydrogen, and $R^5$ and $R^6$ are each independently selected from a $C_1$-$C_5$ alkylene group.

In still another embodiment, the silicone compound may be a compound in which A in the above Formula 1 has a structure of the above Formula 1-4, $R^1$ and $R^2$ are each selected from a $C_1$-$C_5$ alkoxy group, and n is 2 or 3.

The composition for a semiconductor process may further comprise a reaction product of the first component and the second component.

Specifically, when the composition for a semiconductor process is applied to a semiconductor process, the first component and the second component may be sequentially applied, or the first component and the second component may be mixed in advance and then applied.

In the case where the first component and the second component are sequentially applied to a semiconductor process, the reaction product of the two components is formed in the semiconductor process, which is contained in the composition for a semiconductor process. Meanwhile, in the case where the first component and the second component are mixed in advance and then applied to a semiconductor process, the reaction product of the two components may be already formed in the composition for a semiconductor process before the application thereof to the semiconductor process, or the reaction product may be formed at a specific temperature condition after the composition for a semiconductor process is applied to the semiconductor process.

Meanwhile, when the composition for a semiconductor process is applied to a semiconductor process, it may be possible that the first components react with each other or the second components react with each other under specific process conditions of the semiconductor process. In such event, the composition for a semiconductor process may further comprise a reaction product of the first components; or a reaction product of the second components.

The composition for a semiconductor process may further comprise a solvent depending on the application thereof. Specifically, the solvent may comprise water or a polar organic solvent. In such event, the composition for a semiconductor process has an advantage of a high cleaning or removing effect as compared with the case where a nonpolar organic solvent is used.

In an embodiment, the polar organic solvent may comprise at least one selected from the group consisting of alcohol, glycol, lactone, lactam, sulfoxide, sulfone, amide, urea, imidazolidinone, nitrile, and pyrrolidone.

The content of the solvent in the composition for a semiconductor process may be determined within a range in which the sum of the total content of the components excluding the solvent and the content of the solvent is 100% by weight in total.

The first component is an acid component that performs an oxidizing action in the composition for a semiconductor process. It may comprise an inorganic acid, an organic acid, or both.

In an embodiment, the content of the first component in the composition for a semiconductor process may be about 50% by weight to about 99% by weight, for example, about 50% by weight to about 90% by weight, for example, about 70% by weight to about 90° % by weight, for example about 75% by weight to about 90% by weight, for example about 75% by weight to about 85° % by weight. In such event, the composition for a semiconductor process may be suitable for use in etching and removing applications.

In another embodiment, the content of the first component in the composition for a semiconductor process may be about 0.5% by weight to about 30% by weight, for example, about 0.5% by weight to about 10% by weight, for example, about 0.5% by weight to about 5% by weight. In such event, the composition for a semiconductor process may be suitable for use in a cleaning application.

Specifically, the inorganic acid may comprise at least one selected from the group consisting of sulfuric acid, nitric acid, phosphoric acid, silicic acid, boric acid, hydrochloric acid, hydrofluoric acid, and perchloric acid. In addition, the organic acid may comprise at least one selected from the group consisting of acetic acid, formic acid, gluconic acid, lactic acid, oxalic acid, and hydrocarbonic acid.

In an embodiment, the first component may comprise at least one selected from the group consisting of sulfuric acid, phosphoric acid, and hydrofluoric acid. In the case where the first component comprises sulfuric acid, the function of removing organic substances may be enhanced. In the case where it comprises hydrofluoric acid, the cleaning function may be enhanced. In the case where it comprises phosphoric acid, the function of removing a metal nitride film may be enhanced.

The second component serves to form a protective film for a specific component in the semiconductor process or to assist in etching or removing a specific component.

The content of the second component in the composition for a semiconductor process may be greater than about 0.001% by weight less than about 2% by weight, for example, about 0.01% by weight to about 1% by weight.

The composition for a semiconductor process may further comprise various additives depending on the applications and purposes thereof. Specifically, the additive may comprise at least one selected from the group consisting of a surfactant and a corrosion inhibitor, but it is not limited thereto.

More specifically, the composition for a semiconductor process may comprise, as an additive, hydrogen peroxide, a persulfate, a cyclic amine compound, an ammonium fluoride compound, a transition metal salt, a potassium compound, a urea fluoride, and the like.

The composition for a semiconductor process has properties suitable for application to a semiconductor process according to the composition as described above. Specifically, the composition for a semiconductor process may satisfy specific conditions for the activity thereof to a metal film or a metal oxide film.

More specifically, the composition for a semiconductor process may have an etching selectivity ratio for a metal nitride film to a metal oxide film of 100 or more, for example, 100 to 700, for example, 200 to 700, for example, 300 to 700. Thus, the composition for a semiconductor process can be variously used in a semiconductor process where such selective activity is required.

In addition, the composition for a semiconductor process may have an etching selectivity ratio for a metal nitride film to a metal film of 200 or more, for example, 200 to 700, for example, 300 to 700.

As will be described below, the "etching selectivity ratio" refers to the relative ratio of etching rates of a metal film, a metal oxide film, and a metal nitride film when an etching process is carried out for each of the metal film, the metal oxide film, and the metal nitride film using the composition for a semiconductor process at a temperature of about 150° C. to about 200° C.

The metal film and the metal oxide film may comprise at least one metal selected from the group consisting of germanium (Ge), silicon (Si), aluminum (Al), titanium (Ti), zirconium (Zr), hafnium (Hf), and tantalum (Ta).

In another embodiment, there is provided a semiconductor process, which is carried out using the composition for a semiconductor process.

Specifically, the semiconductor process comprises a cleaning process wherein an organic substance or an inorganic substance is selectively cleaned using the composition for a semiconductor process; a removal process wherein an organic substance or an inorganic substance is selectively removed using the composition for a semiconductor process; or both of them.

That is, the semiconductor process may comprise a cleaning process using the composition for a semiconductor process; a removal process using the composition for a semiconductor process; or both of them.

The composition for a semiconductor process may be used to selectively clean or remove a specific organic substance or a specific inorganic substance in the cleaning process or the removing process. Since the composition for a semiconductor process has a specific reactivity to a specific organic substance or a specific inorganic substance, it may be possible to selectively clean/remove the substance by using it.

Specifically, in the cleaning process or the removing process, other substances than a metal; an organic substance containing the metal; an oxide of the metal may be selectively cleaned or removed.

In such event, the metal may comprise at least one selected from the group consisting of germanium (Ge), silicon (Si), aluminum (Al), titanium (Ti), zirconium (Zr), hafnium (Hf), and tantalum (Ta).

Since the composition for a semiconductor process forms a protective film for a film substance made of the metal, a film substance made of the organic substance containing the metal, or a film substance made of the oxide of the metal, the other components nearby except the above can be removed or cleaned.

For example, the inorganic substance to be selectively removed using the composition for a semiconductor process may include a metal nitride film or a degenerated metal nitride film. In addition, the organic substance to be selectively removed using the composition for a semiconductor process may include an acrylic resin, a urethane resin, and the like.

In an embodiment, the semiconductor process may be a semiconductor fabricating process. The semiconductor fabricating process generally comprises an oxidation process, an exposure process, an etching process, an ion implantation process, a deposition process, a polishing process, a cleaning process, and an ashing process.

In such event, the step of selectively cleaning the organic substance or the inorganic substance using the composition for a semiconductor process may be carried out during at least one process selected from an ion implantation process, an etching process, and an ashing process.

That is, the process of cleaning an organic substance or an inorganic substance using the composition for a semiconductor process may be carried out before, after, and/or during each of an ion implantation process, an etching process, and an ashing process in the course of fabricating a semiconductor.

In the ion implantation process, dopant ions are implanted into a wafer to make it a semiconductor. In the etching process, the surface of a wafer on which the photoresist film pattern has been formed is selectively removed. In the ashing process, the degenerated resist material is carbonized and then removed when a photoresist is removed.

In the respective processes, when the unnecessary components are cleaned, while the parts made of the metal, the organic substance containing the metal, the oxide of the metal, or the like need not be damaged, the cleaning process may be carried out using the composition for a semiconductor process.

In addition, the step of selectively removing the organic substance or the inorganic substance using the composition for a semiconductor process may be carried out during at least one process selected from an exposure process, a deposition process, and an etching process.

That is, the process of removing an organic substance or an inorganic substance using the composition for a semiconductor process may be carried out before, after, and/or during each of an exposure process, a deposition process, and an etching process in the course of fabricating a semiconductor.

In the exposure process, a circuit pattern is formed on the surface of a wafer by using a mask having an image of a circuit. In the deposition process, a material having electrical characteristics is deposited on a wafer.

In the respective processes, when the unnecessary components are cleaned, while the parts made of the metal, the organic substance containing the metal, the oxide of the metal, or the like need not be damaged, the removing process may be carried out using the composition for a semiconductor process.

The step of selectively cleaning or removing the organic substance or the inorganic substance using the composition for a semiconductor process may be carried out at a temperature of about 20° C. to about 300° C., for example, about 20° C. to about 70° C., for example, about 150° C. to about 180° C. The process temperature may be appropriately set by the boiling points of the first component and the second component of the composition for a semiconductor process.

Example

Hereinafter, specific embodiments of the present invention will be described. However, the embodiments described below are intended only to illustrate or explain the present invention. The present invention should not be limited thereto.

Example and Comparative Example

Each experimental beaker equipped with a magnetic bar was charged with the first component, the second component, the solvent, and the additive in the kind and content (% by weight) as shown in Table 1 below, followed by stirring thereof at a speed of 500 rpm at room temperature for 4 hours to prepared a composition for a semiconductor process.

TABLE 1

| | First component | | Second component | | Additive | | Solvent | |
|---|---|---|---|---|---|---|---|---|
| | Kind | Content | Kind | Content | Kind | Content | Kind | Content |
| Ex. 1 | A-1 | 0.5 | B-1 | 0.01 | — | — | D-1 | Balance |
| Ex. 2 | A-1 | 0.5 | B-1 | 0.5 | — | — | D-1 | Balance |
| Ex. 3 | A-1 | 0.5 | B-2 | 0.02 | — | — | D-1 | Balance |
| Ex. 4 | A-1 | 0.5 | B-2 | 0.1 | — | — | D-1 | Balance |
| Ex. 5 | A-1 | 0.5 | B-2 | 0.1 | C-1 | 2.5 | D-1 | Balance |
| Ex. 6 | A-2 | 1 | B-3 | 0.05 | — | — | D-1 | Balance |
| Ex. 7 | A-2 | 1 | B-4 | 0.05 | — | — | D-1 | Balance |
| Ex. 8 | A-2 | 5 | B-5 | 0.05 | — | — | D-1 | Balance |
| Ex. 9 | A-2 | 5 | B-6 | 0.05 | — | — | D-1 | Balance |
| Ex. 10 | A-2 | 5 | B-7 | 0.05 | — | — | D-1 | Balance |
| Ex. 11 | A-2 | 5 | B-8 | 0.05 | — | — | D-1 | Balance |
| Ex. 12 | A-3 | 5 | B-6 | 0.01 | — | — | D-1 | Balance |
| Ex. 13 | A-3 | 10 | B-7 | 0.01 | — | — | D-2 | Balance |
| Ex. 14 | A-3 | 30 | B-8 | 0.01 | — | — | D-3 | Balance |
| Ex. 15 | A-4 | 5 | B-3 | 0.01 | — | — | D-1 | Balance |
| Ex. 16 | A-4 | 10 | B-4 | 0.01 | — | — | D-1 | Balance |
| Ex. 17 | A-4 | 10 | B-5 | 0.01 | C-1 | 1 | D-1 | Balance |
| Ex. 18 | A-5 | 85 | B-1 | 0.01 | — | — | D-1 | Balance |
| Ex. 19 | A-5 | 85 | B-1 | 0.1 | — | — | D-1 | Balance |
| Ex. 20 | A-5 | 85 | B-2 | 0.1 | — | — | D-1 | Balance |
| Ex. 21 | A-5 | 85 | B-6 | 0.1 | — | — | D-1 | Balance |
| Ex. 22 | A-5 | 85 | B-6 | 1 | — | — | D-1 | Balance |
| Ex. 23 | A-5 | 85 | B-7 | 0.1 | — | — | D-1 | Balance |
| Ex. 24 | A-5 | 85 | B-8 | 0.1 | — | — | D-1 | Balance |
| C. Ex. 1 | A-1 | 0.5 | — | — | — | — | D-1 | Balance |
| C. Ex. 2 | A-1 | 0.5 | B-1 | 0.001 | — | — | D-1 | Balance |
| C. Ex. 3 | A-1 | 0.5 | B-2 | 2 | — | — | D-1 | Balance |
| C. Ex. 4 | A-2 | 1 | — | — | — | — | D-1 | Balance |
| C. Ex. 5 | A-2 | 5 | — | — | — | — | D-1 | Balance |
| C. Ex. 6 | A-5 | 85 | — | — | — | — | D-1 | Balance |
| C. Ex. 7 | A-5 | 85 | B-1 | 0.001 | — | — | D-1 | Balance |
| C. Ex. 8 | A-5 | 85 | B-2 | 0 | — | — | D-1 | Balance |

First Component
A-1: hydrofluoric acid
A-2: sulfuric acid
A-3: acetic acid
A-4: oxalic acid
A-5: phosphoric acid
Second Component
Each of the second components is a compound of Formula 1 in which A, $R^1$, $R^2$, $R^3$, and n are as shown in Table 2 below.

Additive
C-1: ammonium fluoride
Solvent
D-1: water
D-2: dimethyl sulfoxide
D-3: NMP

TABLE 2

$$A\left[\begin{array}{c} R^1 \\ | \\ Si-R^2 \\ | \\ R^3 \end{array}\right]_n \quad \text{[Formula 1]}$$

| | A | $R^1$ | $R^2$ | $R^3$ | n |
|---|---|---|---|---|---|
| B-1 | Benzene | Ethoxy | Ethoxy | Ethoxy | 2 |
| B-2 | Boron | Ethoxy | Ethoxy | Ethoxy | 3 |
| B-3 | Ethylene | Ethoxy | Ethoxy | Methyl | 2 |
| B-4 | Ethylene | Ethoxy | Ethoxy | Ethoxy | 2 |
| B-5 | Ethylene | Chloride | Chloride | Chloride | 2 |
| B-6 | Bispropylamine | Ethoxy | Ethoxy | Ethoxy | 2 |
| B-7 | Biphenyl | Ethoxy | Ethoxy | Ethoxy | 2 |
| B-8 | Biphenyl | Ethoxy | Ethoxy | Ethoxy | 3 |

Evaluation

Test Example 1: Evaluation of Cleanability

The compositions for a semiconductor process prepared in Examples 1 to 17 and Comparative Examples 1 to 5 were each evaluated for the cleanability thereof.

Specifically, a germanium (Ge) film having a thickness of 1000 Å and a hafnium oxide ($HfO_2$) film having a thickness of 500 Å were formed on a silicon wafer. Subsequently, a photoresist was uniformly coated thereon, which was then maintained at 150° C. for 10 minutes to form a thin film. Subsequently, light having a wavelength of 365 nm was irradiated at a rate of 200 mJ/cm$^2$ onto the thin film using an ultra-high-pressure mercury lamp (USH-250D, Ushio Denki Co., Ltd.) under the atmospheric conditions. No separate optical filter was used.

The thin film irradiated with an ultraviolet ray was immersed in a developer of an aqueous solution of tetramethylammonium hydroxide (TMAH) for 80 seconds for the development thereof. Subsequently, it was rinsed with distilled water, dried with nitrogen gas, and heated in a heating oven at 150° C. for 10 minutes to form a pattern. Subsequently, it was sequentially subjected to an ion implantation process, an etching process, and an ashing process to prepare a specimen.

The compositions for a semiconductor process of Examples 1 to 17 and Comparative Examples 1 to 5 were each maintained at a constant temperature of 60° C. Then, the prepared specimen was immersed therein for 2 minutes. The specimen was then taken out and rinsed with water for 1 minute. It was then completely dried with nitrogen gas, and the cleaning effect was checked by scanning electron microscope (SEM).

Here, the evaluation criteria are as follows. The results are as shown in Table 3 below.
<Evaluation Criteria>
Excellent: 99% or more removed
Good: 90% to less than 99% removed
Normal: 80% to less than 90% removed
Bad: less than 80% removed Test Example 2: Evaluation of Corrosion The compositions for a semiconductor process of Examples 1 to 17 and Comparative Examples 1 to 5 were each evaluated for the corrosion thereof.

The compositions for a semiconductor process of Examples 1 to 17 and Comparative Examples 1 to 5 were each maintained at a constant temperature of 60° C. Then, the specimen prepared according to Test Example 1 was immersed therein for 10 minutes. The specimen was then taken out and rinsed with water for 1 minute. It was then completely dried with nitrogen gas, and the corrosion effect was checked by scanning electron microscope (SEM). The etching rate was calculated by dividing the changes in the film thickness by time for each film substance. The results are shown in Table 3 below.

TABLE 3

| | | Corrosion (Å/min) | |
|---|---|---|---|
| | Cleanability | Ge | $HfO_2$ |
| Ex. 1 | Excellent | 2.5 | 2.7 |
| Ex. 2 | Excellent | — | — |
| Ex. 3 | Excellent | 1.9 | 0.8 |
| Ex. 4 | Excellent | 1.5 | 0.5 |
| Ex. 5 | Excellent | 2.0 | 0.8 |
| Ex. 6 | Excellent | 2.1 | — |
| Ex. 7 | Excellent | 1.7 | — |
| Ex. 8 | Excellent | 1.6 | — |
| Ex. 9 | Excellent | 1.7 | — |
| Ex. 10 | Excellent | 1.0 | — |
| Ex. 11 | Good | 1.4 | — |
| Ex. 12 | Good | — | — |
| Ex. 13 | Good | — | — |
| Ex. 14 | Good | 0.4 | 0.2 |
| Ex. 15 | Good | 0.3 | 0.2 |
| Ex. 16 | Good | 0.2 | 0.1 |
| Ex. 17 | Excellent | 0.5 | 0.2 |
| C. Ex. 1 | Excellent | Greater than 100 | Greater than 100 |
| C. Ex. 2 | Excellent | Greater than 100 | Greater than 100 |
| C. Ex. 3 | Bad | — | — |
| C. Ex. 4 | Excellent | 34 | 1.2 |
| C. Ex. 5 | Excellent | 67 | 1.6 |

Test Example 3: Evaluation of Etchability

The compositions for a semiconductor process of Examples 18 to 24 and Comparative Examples 6 to 8 were each evaluated for the etchability thereof for a nitride film.

Prepared were a sample in which a silicon nitride ($Si_3N_4$) film having a thickness of 2,000 Å was formed on a silicon wafer by a chemical vapor deposition (CVD) method; a sample in which a silicon oxide ($SiO_x$) film having a thickness of 200 Å was formed on a silicon wafer using a chemical vapor deposition (CVD) method; and a silicon single crystal sample having a thickness of 1500 Å.

Subsequently, each sample was immersed in each composition for a semiconductor process of Examples 18 to 24 and Comparative Examples 6 to 8, which was being maintained at 160° C. in a stirring tank made of quartz and stirred at a speed of 500 rpm, to carry out an etching process. Upon completion of the etching process, the sample was rinsed with ultrapure water and then dried using a drying apparatus.

Then, the thickness of each sample upon the etching was measured using a scanning electron microscope (SEM) and an ellipsometer. The etching rate was measured for the changes in the thin film thickness before and after the etching process. The results are as shown in Table 4 below.

The etching selectivity ratio was calculated by obtaining the etching rate ratio for each of the silicon nitride film, the silicon oxide film, and the silicon single crystal sample. The results are as shown in Table 4 below.

TABLE 4

|  | Corrosion (Å/min) | | | Etching selectivity ratio | |
|---|---|---|---|---|---|
|  | SiOx | Si$_3$N$_4$ | Si | Si$_3$N$_4$/Si | Si$_3$N$_4$/SiOx |
| Ex. 18 | 0.5 | 63 | 0.1 | 630 | 126 |
| Ex. 19 | 0.1 | 67 | 0.3 | 223 | 670 |
| Ex. 20 | 0.2 | 61 | 0.2 | 305 | 305 |
| Ex. 21 | 0.2 | 65 | 0.1 | 650 | 325 |
| Ex. 22 | 0.3 | 65 | 0.1 | 650 | 217 |
| Ex. 23 | 0.2 | 62 | 0.2 | 310 | 310 |
| Ex. 24 | 0.2 | 64 | 0.3 | 213 | 320 |
| C. Ex. 6 | 4.3 | 66 | 2.7 | 24 | 15 |
| C. Ex. 7 | 3.7 | 65 | 2.5 | 26 | 18 |
| C. Ex. 8 | 0.1 | 36 | 0.2 | 180 | 360 |

As described above, the compositions for a semiconductor process of Examples 1 to 24 produce an advantageous effect in terms of protection for a metal or a metal oxide film, as compared with the compositions for a semiconductor process of Comparative Examples 1 to 8. In addition, they produce an excellent effect in the removal and etching of a metal nitride film.

The invention claimed is:

1. A composition for a semiconductor process, which comprises a first component comprising an inorganic acid or an organic acid; and a second component in an amount of greater than 0.001% by weight less than 2% by weight, the second component comprising a compound represented by the following Formula 1:

[Formula 1]

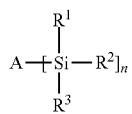

in the above Formula 1, A is selected from a $C_1$-$C_{30}$ aliphatic moiety, a $C_6$-$C_{30}$ aromatic moiety, a boron (B) moiety, and an amine moiety, $R^1$ to $R^3$ are each independently selected from hydrogen, a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aliphatic ring group, a substituted or unsubstituted $C_4$-$C_{30}$ heteroaliphatic ring group, a substituted or unsubstituted $C_6$-$C_{30}$ aromatic ring group, a substituted or unsubstituted $C_4$-$C_{30}$ heteroaromatic ring group, a substituted or unsubstituted amine group, and a halogen group, at least one of $R^1$ to $R^3$ is a $C_1$-$C_{30}$ alkoxy group or a halogen group, and n is an integer of 2 to 6.

2. The composition for a semiconductor process of claim 1, which further comprises a reaction product of the first component and the second component.

3. The composition for a semiconductor process of claim 1, wherein the $C_1$-$C_{30}$ aliphatic moiety is selected from a substituted or unsubstituted $C_1$-$C_{30}$ alkyl group, a substituted or unsubstituted $C_3$-$C_{30}$ cycloalkyl group; a substituted or unsubstituted $C_2$-$C_{30}$ heterocycloalkyl group; a substituted or unsubstituted $C_2$-$C_{30}$ alkenyl group; a substituted or unsubstituted $C_3$-$C_{30}$ cycloalkenyl group; a substituted or unsubstituted $C_2$-$C_{30}$ heterocycloalkenyl group; a substituted or unsubstituted $C_2$-$C_{30}$ alkynyl group.

4. The composition for a semiconductor process of claim 1, wherein the $C_6$-$C_{30}$ aromatic moiety is selected from a substituted or unsubstituted $C_6$-$C_{30}$ aromatic ring; and a substituted or unsubstituted $C_4$-$C_{30}$ heteroaromatic ring group.

5. The composition for a semiconductor process of claim 1, wherein A in the above Formula 1 is one selected from the following Formulae 1-1 to 1-5:

1-1

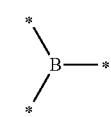

1-2

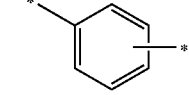

1-3

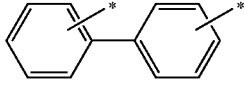

1-4

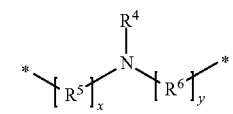

1-5 in the above Formula 1-5, $R^5$ and $R^6$ are each independently selected from a substituted or unsubstituted alkylene group; a substituted or unsubstituted $C_3$-$C_{30}$ cycloalkylene group; a substituted or unsubstituted $C_2$-$C_{30}$ heterocycloalkylene group; a substituted or unsubstituted $C_2$-$C_{30}$ alkenylene group; a substituted or unsubstituted $C_3$-$C_{30}$ cycloalkenylene group; a substituted or unsubstituted $C_2$-$C_{30}$ heterocycloalkenylene group; and a substituted or unsubstituted $C_2$-$C_{30}$ alkynylene group, $R^4$ is selected from hydrogen; a substituted or unsubstituted $C_1$-$C_{30}$ alkyl group, a substituted or unsubstituted $C_3$-$C_{30}$ cycloalkyl group; a substituted or unsubstituted $C_2$-$C_{30}$ heterocycloalkyl group; a substituted or unsubstituted $C_2$-$C_{30}$ alkenyl group; a substituted or unsubstituted $C_3$-$C_{30}$ cycloalkenyl group; a substituted or unsubstituted $C_2$-$C_{30}$ heterocycloalkenyl group; and a substituted or unsubstituted $C_2$-$C_{30}$ alkynyl group, and x and y are each independently an integer of 1 to 20.

6. The composition for a semiconductor process of claim 1, which further comprises a solvent, wherein the solvent comprises water or a polar organic solvent.

7. The composition for a semiconductor process of claim 6, wherein the polar organic solvent comprises at least one selected from the group consisting of alcohol, glycol, lactone, lactam, sulfoxide, sulfone, amide, urea, imidazolidinone, nitrile, and pyrrolidone.

8. The composition for a semiconductor process of claim 1, wherein the inorganic acid comprises at least one selected from the group consisting of sulfuric acid, nitric acid, phosphoric acid, silicic acid, boric acid, hydrochloric acid, hydrofluoric acid, and perchloric acid.

9. The composition for a semiconductor process of claim 1, wherein the organic acid comprises at least one selected from the group consisting of acetic acid, formic acid, gluconic acid, lactic acid, oxalic acid, and hydrocarbonic acid.

10. The composition for a semiconductor process of claim 1, which comprises the first component in an amount of 50% by weight to 99% by weight.

11. The composition for a semiconductor process of claim 1, which comprises the first component in an amount of 0.5% by weight to 30% by weight.

12. The composition for a semiconductor process of claim 1, which has an etching selectivity ratio for a metal nitride film to a metal film of 200 or more, and
    an etching selectivity ratio for a metal nitride film to a metal oxide film of 100 or more.

13. The composition for a semiconductor process of claim 12, wherein the metal film and the metal oxide film each comprise at least one metal selected from the group consisting of germanium (Ge), silicon (Si), aluminum (Al), titanium (Ti), zirconium (Zr), hafnium (Hf), and tantalum (Ta).

14. A semiconductor process, which comprises a cleaning process wherein an organic substance or an inorganic substance is selectively cleaned using the composition for a semiconductor process of claim 1; a removal process wherein an organic substance or an inorganic substance is selectively removed using the composition for a semiconductor process; or both of them.

15. The semiconductor process of claim 14, wherein the cleaning process or the removing process is carried out at a temperature of 20° C. to 300° C.

16. The semiconductor process of claim 14, wherein the cleaning process or the removing process is a process in which other substances than a metal; an organic substance containing the metal; an oxide of the metal are selectively cleaned or removed, and
    the metal comprises at least one selected from the group consisting of germanium (Ge), silicon (Si), aluminum (Al), titanium (Ti), zirconium (Zr), hafnium (Hf), and tantalum (Ta).

* * * * *